United States Patent
Jenkins et al.

(10) Patent No.: US 9,065,601 B1
(45) Date of Patent: Jun. 23, 2015

(54) CIRCUITS FOR AND METHODS OF IMPLEMENTING A RECEIVER IN AN INTEGRATED CIRCUIT DEVICE

(71) Applicant: Xilinx, Inc., San Jose, CA (US)

(72) Inventors: Michael O. Jenkins, San Jose, CA (US); Cheng-Hsiang Hsieh, San Jose, CA (US); Christopher J. Borrelli, Campbell, CA (US)

(73) Assignee: XILINX, INC., San Jose, CA (US)

( * ) Notice: Subject to any disclaimer, the term of this patent is extended or adjusted under 35 U.S.C. 154(b) by 91 days.

(21) Appl. No.: 13/842,604

(22) Filed: Mar. 15, 2013

(51) Int. Cl.
*H04L 7/04* (2006.01)
*H04L 7/00* (2006.01)
*H04L 7/033* (2006.01)

(52) U.S. Cl.
CPC ............ *H04L 7/0012* (2013.01); *H04L 7/0025* (2013.01); *H04L 7/033* (2013.01)

(58) Field of Classification Search
CPC ..... H04L 7/0025; H04L 7/033; H04L 7/0012; H04L 7/0079
USPC .......................................... 375/373, 375–376
See application file for complete search history.

(56) References Cited

U.S. PATENT DOCUMENTS

| | | | | |
|---|---|---|---|---|
| 4,506,232 A | * | 3/1985 | Thompson | 331/16 |
| 6,272,138 B1 | * | 8/2001 | Weon | 370/395.62 |
| 6,397,042 B1 | * | 5/2002 | Prentice et al. | 455/67.14 |
| 6,983,394 B1 | | 1/2006 | Morrison et al. | |
| 7,295,644 B1 | * | 11/2007 | Wu et al. | 375/375 |
| 7,479,814 B1 | | 1/2009 | Kaviani et al. | |
| 7,672,406 B2 | * | 3/2010 | Takeuchi | 375/345 |
| 8,477,895 B1 | * | 7/2013 | Wang et al. | 375/354 |
| 8,681,914 B2 | * | 3/2014 | Sutioso et al. | 375/358 |
| 2004/0190669 A1 | * | 9/2004 | Gutierrez et al. | 375/376 |
| 2005/0193290 A1 | * | 9/2005 | Cho et al. | 714/710 |
| 2006/0083343 A1 | * | 4/2006 | Roederer et al. | 375/375 |
| 2012/0216084 A1 | * | 8/2012 | Chun et al. | 714/708 |

OTHER PUBLICATIONS

U.S. Appl. No. 13/030,558, filed Feb. 18, 2011, Klein, et al.
U.S. Appl. No. 13/362,505, filed Jan. 31, 2012, Taylor et al.
Xilinx, Inc., "All Digital VCXO Replacement for Gigabit Transceiver Applications", Application Note: Virtex-6 and 7 Series FPGAs, XAPP589, v2.0, Oct. 16, 2012, pp. 1-27, 2100 Logic Drive, San Jose, CA US.
Xilinx, Inc. "LogiCORE IP Virtex-6 FPGA Integrated Block v2.3 for PCI Express", Product Specification, DS800, v2.0, Mar. 1, 2011, pp. 1-6, 2100 Logic Drive, San Jose, CA US.

* cited by examiner

*Primary Examiner* — Sophia Vlahos
(74) *Attorney, Agent, or Firm* — John J. King

(57) ABSTRACT

A receiver in an integrated circuit device is described. The circuit comprises a receiver having a clock and data recovery circuit coupled to receive data signals modulated with a transmitter clock signal; and a clock generator coupled to receive an output of the clock and data recovery circuit, the clock generator providing a modulated reference clock to the receiver, based upon a reference clock signal which is independent of the transmitter clock signal; wherein the modulated reference clock provided to the receiver is synchronized with the transmitter clock signal. A method of receiving data in an integrated circuit is also described.

20 Claims, 9 Drawing Sheets

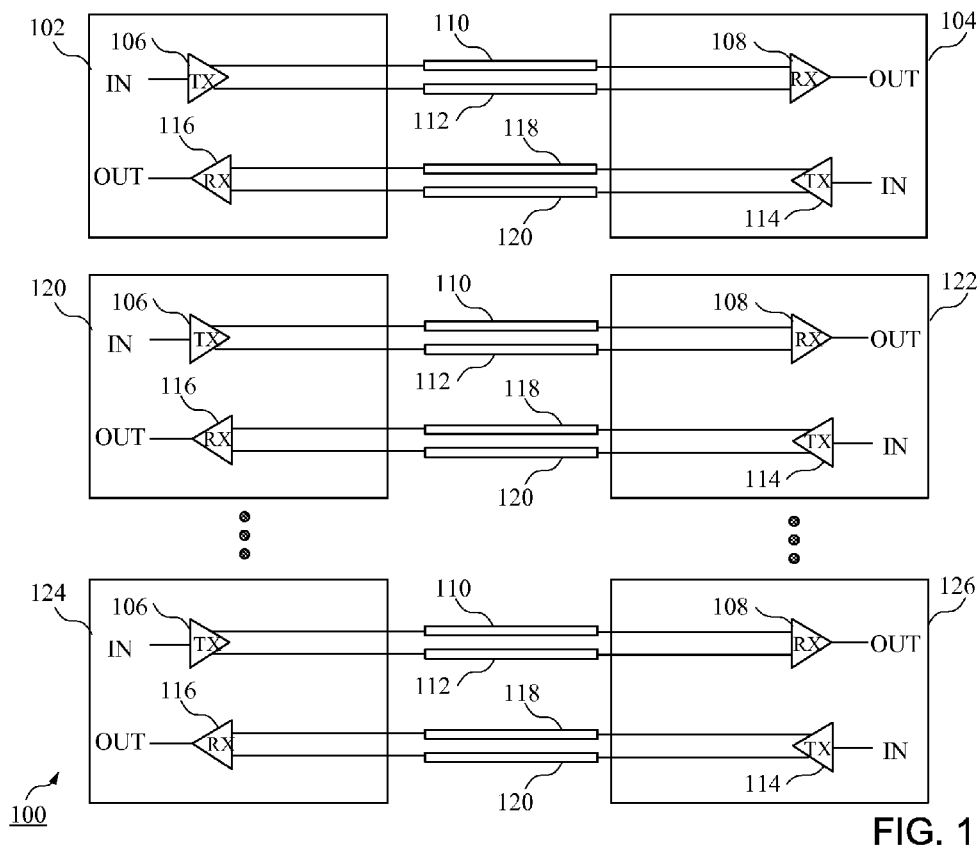
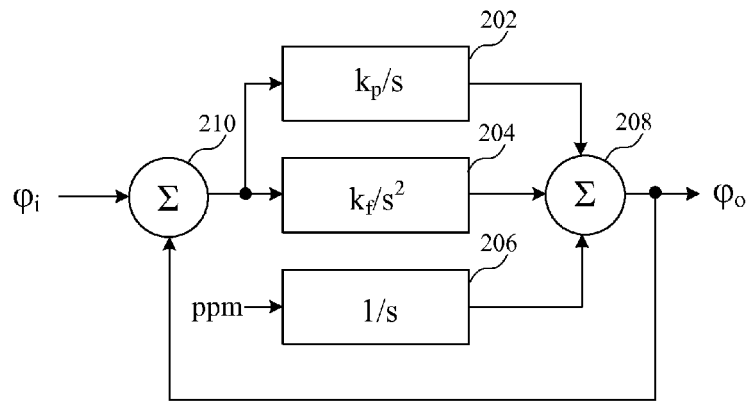
FIG. 1
FIG. 2

CIRCUITS FOR AND METHODS OF IMPLEMENTING A RECEIVER IN AN INTEGRATED CIRCUIT DEVICE

FIELD OF THE INVENTION

The present invention relates generally to integrated circuit devices, and in particular, to circuits for and methods of implementing a receiver in an integrated circuit device.

BACKGROUND OF THE INVENTION

Data transmission is an important application of many integrated circuit devices. Data may be transmitted according to different transmission protocols, and may be transmitted as serial data or parallel data. If both ends of a serial link use the same reference clock signal (i.e., a synchronous receiver (RX) input clock signal), then the clock and data recovery (CDR) architecture can be relatively simple, and may require only a phase error circuit.

However, each end of a serial data transmission link may use a separate, uncorrelated reference clock. If the frequencies of the near-end and far-end reference clocks are different, then the phase error must change continuously. As the difference in reference clock frequencies increases, the phase error must change more quickly, impacting the data recovery performance. The more extreme the difference in frequency and speed of change of frequency between the two ends of the link, the more difficult it is for the receiver to correctly recover the data. Eventually, a frequency error circuit may be required to accommodate asynchronous inputs.

Independent modulation to reduce electro-magnetic interference (EMI), termed Spread Spectrum Clocking (SSC), continuously varies the frequency of a reference clock. If the variation at each end of the link is uncorrelated with the other end, extreme changes in relative phase and frequency at each end of the link may be created, making it difficult to recover data.

SUMMARY OF THE INVENTION

A receiver in an integrated circuit device is described. The circuit comprises a receiver circuit having a clock and data recovery circuit coupled to receive data signals modulated with a transmitter clock signal; and a clock generator coupled to receive an output of the clock and data recovery circuit, the clock generator providing a modulated reference clock to the receiver, based upon a reference clock signal which is independent of the transmitter clock signal; wherein the modulated reference clock is synchronized with the transmitter clock signal.

According to an alternate arrangement, a receiver in an integrated circuit comprises a receiver circuit coupled to receive data signals modulated with a transmitter clock signal; an adaptation circuit coupled to the receiver circuit, the adaptation circuit detecting changes in a phase of the transmitter clock signal; and a clock generator coupled to receive an output of the adaptation circuit, the clock generator providing a modulated reference clock to the receiver circuit based upon a reference clock signal of the receiver which is independent of the transmitter clock signal; wherein the modulated reference clock is synchronized with the transmitter clock signal.

A method of receiving data in an integrated circuit device is also described. The method comprises receiving data signals modulated with a transmitter clock signal; and providing a modulated reference clock signal based upon a reference clock signal which is independent of the transmitter clock signal; wherein the modulated reference clock signal is synchronous with the transmitter clock signal.

BRIEF DESCRIPTION OF THE DRAWINGS

FIG. 1 is a block diagram of a circuit for communicating data;

FIG. 2 is a block diagram of a circuit for implementing a receiver in an integrated circuit which receives a signal generated with a clock signal having a frequency offset;

DETAILED DESCRIPTION OF THE DRAWINGS

Figure 3:
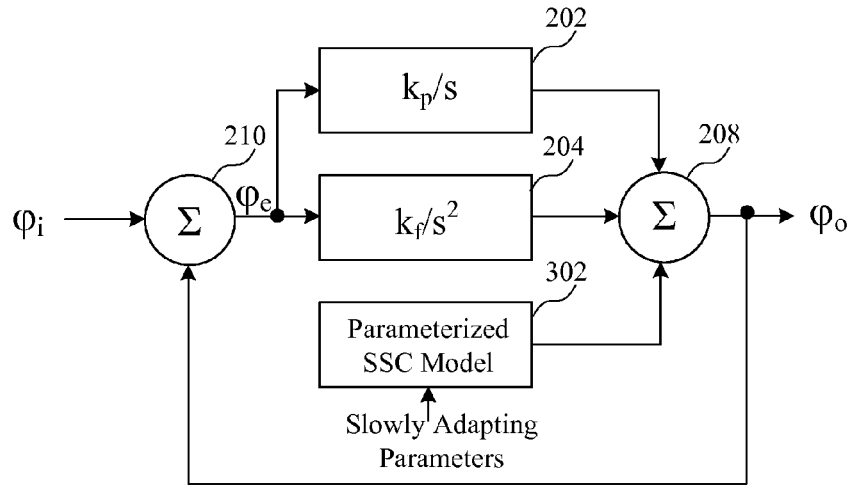
FIG. 3 is a block diagram of a circuit for implementing a receiver in an integrated circuit which receives a signal generated with spread spectrum clock signal.

Turning first to FIG. 1, a block diagram of a circuit for communicating data is shown. The circuit 100 as shown comprises a plurality of bi-direction communication links each having a transmitter and a receiver. In a first pair of transceivers 102 and 104, a transmitter circuit 106 of the transceiver 102 is coupled to a receiver circuit 108 of the transceiver 104 by way of a pair of transmission lines 110 and 112. Similarly, a transmitter circuit 114 is coupled to a receiver circuit 116 by way of transmission lines 118 and 120. While differential data may be transmitted in the pair of differential lines 110/112 and 118/120, it should be understood that differential data is shown by way of example, and that the various circuits and methods of implementing a receiver in an integrated circuit set forth below could be implemented using a transmitter/receiver pair which is adapted to transmit single-ended data. The circuit 100 comprises a plurality of transceiver pairs, including transceiver pairs 120/122 and 124/126, each of which have both a transmitter and a receiver, and are coupled by transmission lines as in the transceiver pair 102/104. Although transceiver pairs are shown, it should be understood that the circuits and methods could be applied to individual data links between a transmitter and a receiver. While various data transfer protocols could be implemented using the various transmitters and receivers of FIG. 1, the circuit of FIG. 1 could be used to implement a PCI Express bus, for example.

As will be described in more detail below, the various circuits and methods set forth below adaptively generate a reference clock at a receiver with the same modulation as the received data, allowing the recovery of data to be much simpler and more robust on both ends of a communication link. A low-bandwidth error signal from a CDR circuit enables controlling an adaptive model of a reference clock modulation. Using this modulated reference clock for the receiver that generates the low-bandwidth error signal closes the loop, synchronizing the reference clocks at both ends of a communication link. This modulated reference clock can also be used for other receivers and transmitters, such as receivers or transmitters on the same PCI Express bus. CDR circuits at both ends will then be required to recover only synchronous inputs. The phase locking of a local reference clock to the modulation on the serial input data allows customization of CDR performance to meet multiple application requirements based on only a single silicon implementation.

Turning now to FIG. 2, a block diagram of a circuit for implementing a receiver in an integrated circuit which receives a signal generated with a clock signal having a frequency offset is shown. The circuit of FIG. 2 shows the generation of an output phase $phi_o$ ($\phi_o$) of a circuit implementing a second order clock-data recovery circuit with a linear adaptive reference clock signal, where the output phase $\phi_o$ is generated based upon an input phase $\phi_1$. Two clock signals can vary in phase only or in both frequency and phase, where frequency is the first derivative of phase. While a phase of a given clock signal may be out of phase with another clock signal (e.g., two reference clock signals generated on different ends of a communication link), the two clock signals can be brought into phase and operate as synchronous signals by adjusting the phase of one of the signals.

Referring specifically to the circuit of FIG. 2, a phase control block 202 and a frequency control block 204 are implemented along a fixed frequency adaptation block 206 to accommodate for a fixed frequency offset of a receiver clock with respect to a transmitter clock signal used to generate data received at a receiver. That is, the phase control block 202 and the frequency control block 204 provide second order control of the output phase of the clock signal to account for variations in phase due to frequency drift for example, while adaptation circuit 206 is provided to account for a known, fixed frequency difference between clock signals on the two ends of a communication link. Outputs of the phase control block 202, the frequency control block 204, and the adaptation block 206 are provided to a summing circuit 208 to generate the correct output phase $\phi_o$. The output phase $\phi_o$ is fed back to a summing circuit 210 which also receives the input phase $\phi_i$.

If the frequencies of the two clock signals are different, the phase difference between the clock signals will continuously change, and need to be continuously adjusted. Even if it is intended that the two clock signals have the same frequency, the actual frequencies of the two clock signals may be slightly different if they are generated using different clock generators. Because the frequency of a clock signal generated by clock generator may drift or change over time (due to temperature changes for example), the frequencies of clock signals generated on different ends of a communication link would likely be different even if they were initially identical. If different clock signal generators are used to generate clock signals associated with circuits on different ends of a communication link, the clock signals on the different ends of the communication will not only vary in frequency, but their phase will gradually change as a result of the difference in frequency. While the clock signals may phase align at some point, it will be necessary to adjust the phase of a given clock signal (which has changed as a result of frequency drift for example) with respect to the other clock signal to keep the clock signals in phase.

However, the phase variation between two signals on two ends of a communication link can be better controlled if a recovered clock associated with a transmitter clock signal (which is used for generating data sent to a receiver) is used for receiving data. Because the recovered clock is generated using a local reference clock (i.e., a clock which is independent of the transmitter clock and received by the receiver or generated by a clock generator of the receiver) or a clock generated using an oscillator for example (which is also independent of the transmitter clock), the relative phases of the recovered clock and the transmitter clock signal will vary over time, and phase control (and possibly frequency control) will be necessary to align the recovered clock signal (used to receive the data) with the transmitter clock signal (used to transmit the data). However, by generating a clock signal at the receiver which is synchronized to a transmitter clock signal, the receiver will be better able to receive data, particularly when a spread spectrum clock signal is used as a transmitter clock signal. Because the clock signal at the receiver will be synchronous with the transmitter clock signal, it will be easier to maintain the correlation between the transmitter clock signal and the receiver clock signal using a phase control circuit and possibly a frequency control circuit. That is, the phase and frequency control circuits will not be required to adjust the phase or frequency of the receiver clock signal due to a change in frequency of the transmitter clock signal as a result of spread spectrum clocking, but rather due to the ordinary drift of the receive clock signal.

According to a circuit arrangement of FIG. 3, a parameterized SSC model circuit 302 may be implemented to account for variations in frequency other than fixed frequency offset or drift in frequency of a clock signal generated at the receiver. For example, the parameterized SSC model circuit 302 may account for a transmitter clock signal which may be implemented as a spread spectrum clock signal to transmit data. More particularly, the parameterized SSC model will receive slowly adapting parameters, such as an output of a CDR circuit. More details related to the phase control circuit 202, the frequency control circuit 204, and the parameterized SSC model circuit 302 will be provided in reference to FIG. 4 described in more detail below. While the arrangement of FIG. 3 provides a potentially non-linear response, the arrangements of FIGS. 5 and 8 which will be described in more detail below provide linear responses.

Figure 4:
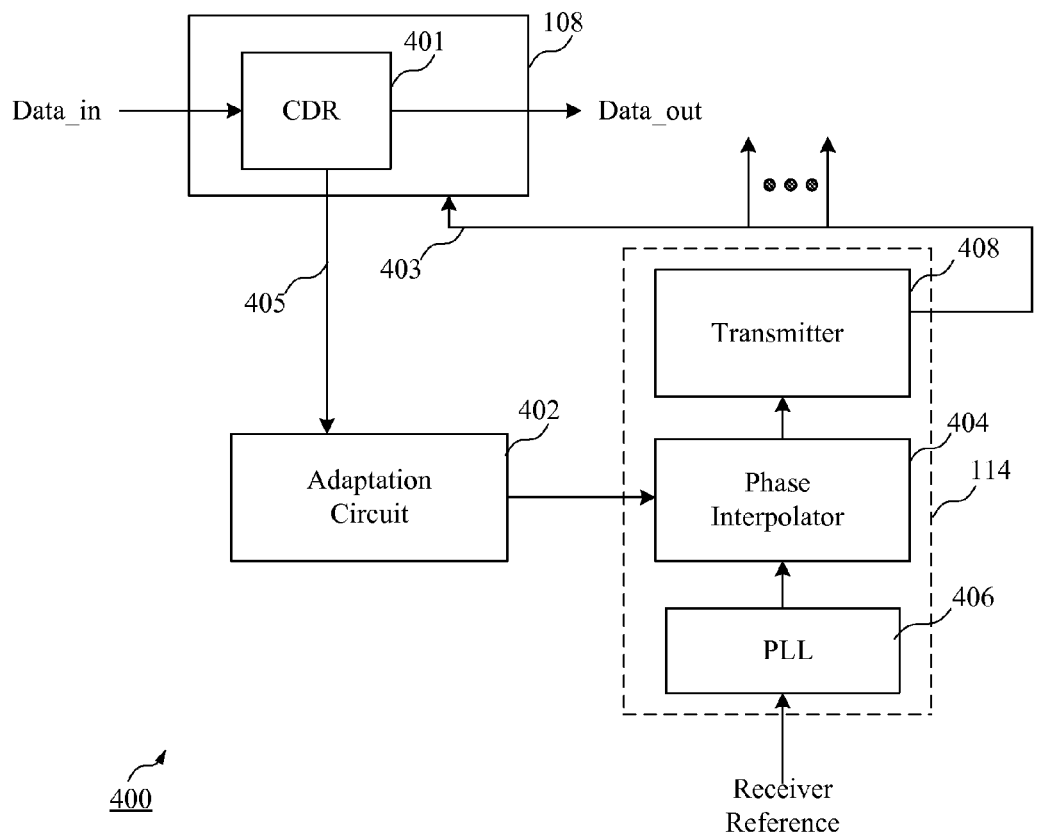
FIG. 4 is a block diagram of a receiver circuit having an adaptation circuit for modulating a reference clock to correspond to a transmitter clock used to transmit the input data to the receiver circuit.

Turning now to FIG. 4, a block diagram of a receiver circuit 400 having an adaptation circuit for modulating a reference clock signal to be synchronous with a transmitter clock signal (used to transmit input data to the receiver circuit) is shown. An existing receiver includes an output representing the phase error between the local reference clock of the receiver (i.e., the receiver reference clock signal) and the input serial data. A parameterized model to generate a modulated reference clock signal (with the same modulation as on the input serial data) which is used to receive the input serial data. An adaptation circuit controls a phase interpolator (PI), which may be a phase interpolator of an unused transmitter which then transmits the modulated reference clock signal for the receiver. The use of this modulated reference clock signal by the receiver closes the loop, synchronizing the modulated reference clock signal of the receiver with the reference clock signal of the transmitter used to transmit the data from the far end of the serial link. Hence, the receiver CDR effectively sees only synchronous input data.

More particularly, the receiver circuit 400 comprises a data receiver 108 having a CDR circuit 401, which may provide phase and frequency alignment due to unintended variations in a clock generator (such as due to frequency drift). An adaptation circuit 402 coupled to an output of the CDR circuit 401 is used to generate a receiver clock signal 403 which is synchronous with the transmitter clock signal used to modulate the data transmitted to the receiver.

The adaptation circuit 402 controls a transmitter circuit to generate a clock signal 403 which is synchronous with the transmitter clock signal used to transmit data to the receiver of FIG. 4. More particularly, a phase interpolator 404 is coupled to receive a clock signal generated by a phase locked loop (PLL) circuit 406 based upon a receiver reference clock signal. The receiver reference clock signal may be an internal reference clock signal for the receiver generated by an oscillator for the receiver for example, and therefore would not have any correlation with the transmitter clock signal. Alternatively, the receiver reference clock signal may be any other clock signal received by the receiver which is independent of the transmitter clock signal. The phase interpolator 404 provides a clock signal, which is synchronous in frequency and phase with the transmitter clock signal, which is provided to a transmitter 408. The transmitter 408 provides the clock signal 403 to the receiver.

The transmitter circuit could be transmitter 114 associated with the receiver 108 of the transceiver 104. That is, assuming that the transmitter circuit 114 is not being used to transmit data, the various elements of the transmitter circuit could be used to generate a modulated clock signal which is coupled to the receiver 108. Accordingly, transmitter 114 of transceiver 104, which is implemented as any of the other transmitters 106 or 114 used to transmit data, is used to receive data. Other receivers on the same bus (i.e., receiving data timed by the same far-end reference clock signal) can also use the modulated reference clock signal coupled to the receiver 108. If transmitters on these same links also use the modulated reference clock signal, the far end CDR circuits will derive similar benefit. The circuit of FIG. 4 provides a particular advantage where a spread spectrum clock signal may be required on both sides of a communication link. That is, a spread spectrum clock need only be provided on one end of the communication link (e.g., a transmitter), and spread spectrum clock signaling can be implemented on the other end of the communication link (e.g., a receiver) by synchronizing the clock signals.

Figure 5:
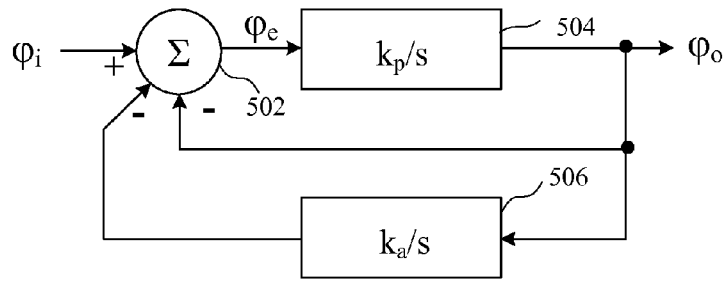
FIG. 5 is a block diagram showing a circuit for generating a clock signal to receive data using a first order clock and data recovery circuit and a linear adaptive reference clock circuit.

Turning now to FIG. 5, a block diagram shows a circuit for generating a clock signal to receive data using a first order clock and data recovery circuit and a linear adaptive reference clock circuit. A receiver with a reference clock signal is created via a low gain accumulator controlling a phase-interpolated output of an unmodulated reference clock signal. More particularly, a summing circuit 502 is coupled to receive an input phase $\phi_i$ and subtract outputs of a phase control block 504 and an adaptation block 506 to generate a phase error $\phi_e$, where $$\frac{\varphi e}{\varphi i} = s^2 / (s^2 + sk_p + k_p k_a).$$

Figure 6:
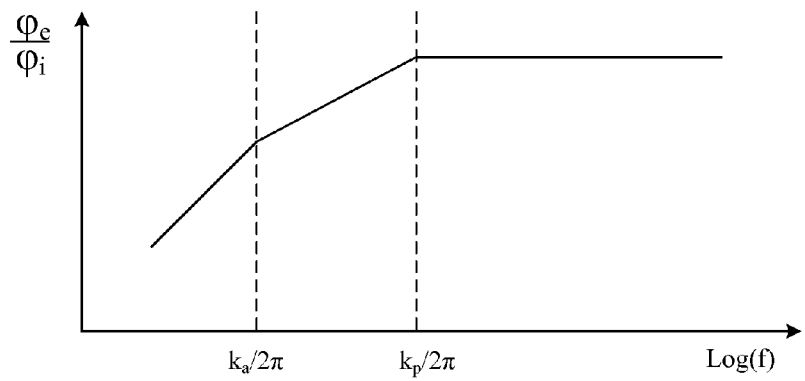
FIG. 6 is a graph showing the frequency dynamics of the circuit of FIG. 5.

The adaptation block 506 provides phase rotation with very low bandwidth. The resulting dynamics are those of a second order CDR circuit as can be seen in the graph of FIG. 6 which shows the ratio of $\phi_e/\phi_i$ as a function of the Log(f). The low gain of the accumulator, which requires only a low bandwidth input, maintains the original first order pole in approximately the same frequency (i.e., $k_p/2\pi$) while adding a second pole at a much lower frequency (i.e., $k_a/2\pi$), resulting in much better tracking of low frequency modulation and jitter. As will be described in more detail in reference to FIG. 7, the adaptation block could be implemented using an integrator with a slowing adapting, quasi-static input (e.g., the output of a clock and data recovery circuit).

Figure 7:
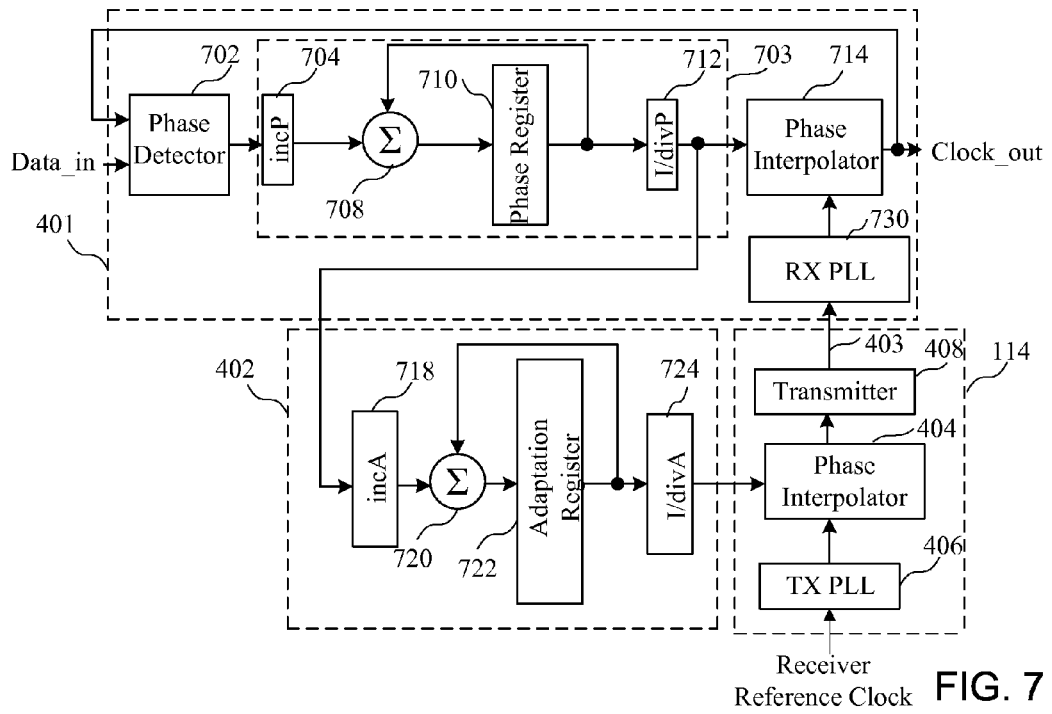
FIG. 7 is a more detailed block diagram showing a circuit for generating a clock signal to receive data using a first order clock and data recover circuit and a linear adaptive reference clock circuit implementing the circuit of FIG. 5.

Turning now to FIG. 7, a more detailed block diagram shows a circuit for generating a clock signal to receive data using a first order clock and data recovery circuit and a linear adaptive reference clock circuit according to the circuit of FIG. 5. In particular, a phase detector 702 is coupled to receive a data input signal (Data_in) and an output clock signal generated by the receiver. An output of the phase detector is provided to a phase control circuit 703, which implements a phase control loop and may be an integrator implemented by an accumulator and two scaling factors. The phase control circuit 703 as shown comprises a gain block 704 having a multiply factor (incP) coupled to receive an output of the phase detector 702. The multiply factor may comprise a binary value, for example. A summing circuit 708 receives the output of the gain block 704 and an output of a phase register 710 which stores a previous output of the summing circuit 708. The output of the phase register is also coupled to a second scaling factor, a divider block 712 having a divider factor (I/divP). The output of the divider factor 712 is coupled to the phase interpolator 714, and represents a measure of the phase error for the phase interpolator 714. The phase detector 702, phase control circuit 703, and phase interpolator 714 may be part of the clock and data recovery circuit, 401 for example. An example of a phase interpolator will be described in more detail in reference to FIG. 13.

The output of the phase control circuit 703 is also coupled to the adaptation circuit 402 which controls the transmitter circuit 114. The adaptation circuit 402 is an integrator which may also be implemented by an accumulator and two scaling factors. The adaptation circuit 402 as shown comprises a gain block 718 comprising a first scaling factor having a multiply factor (incA) coupled to receive an output of the phase control block 703. A summing circuit 720 receives the output of the gain block 718 and an output of an adaptation register 722 which stores a previous output of the summing circuit 720. The output of the adaptation register is also coupled to a second scaling factor, a divider block 724 having a divider factor (I/divP). The output of the divider block 724 is coupled to the phase interpolator 404 of the transmitter 114. The output of the transmitter circuit 114 is coupled to a receiver PLL 730, the output of which is coupled to the phase interpolator 714. The phase interpolator 714 will generate an output clock signal, Clock_out, used by the receiver for latching the input data based upon the output of the phase control circuit 703 and a clock signal generated by the receiver PLL 730.

Accordingly, the adaptation circuit 402 modulates a local reference clock signal of the receiver, shown here as the receiver reference clock signal, based upon an output of the phase control circuit 703 which is a slowly adapting parameter indicating a phase difference between the input data and a clock signal generated by the clock and data recovery circuit used to receive the data. By using the output of the phase control circuit 703 to modulate an internal reference clock signal of the receiver, a second order control circuit can be implemented which provides better low frequency response. In order to ensure that the output of the phase control circuit 703 does not wrap around, an up/down counter can be implemented to represent bits above the CDR output.

Figure 8:
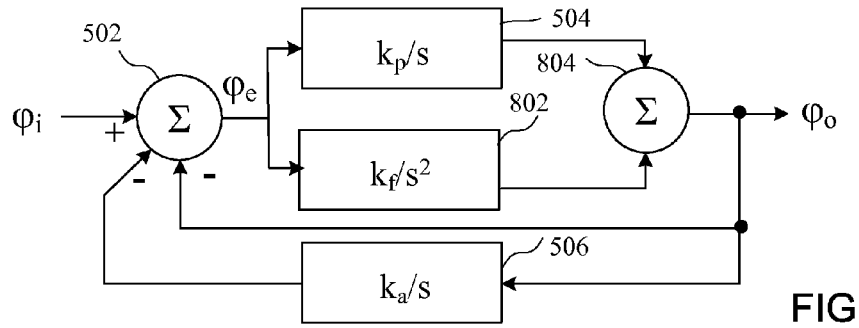
FIG. 8 is a block diagram showing a circuit for generating a clock signal to receive data using a second order clock and data recovery circuit and a linear adaptive reference clock circuit.

Turning now to FIG. 8, a block diagram shows a circuit for generating a clock signal to receive data using a second order clock and data recovery circuit and a linear adaptive reference clock circuit. The circuit arrangement of FIG. 8 is similar to FIG. 5, except that a frequency block control block 802 is added in parallel with the phase control block 504, the outputs of which are coupled to a summing circuit 804. The output of the summing circuit 804 is subtracted from the input phase $\phi_i$, and provided to the adaptation control block 506, the output of which is also subtracted from the input phase $\phi_i$, where $$\frac{\varphi e}{\varphi i} = s^2 / (s^2 + sk_p + k_p k_a).$$

Figure 9:
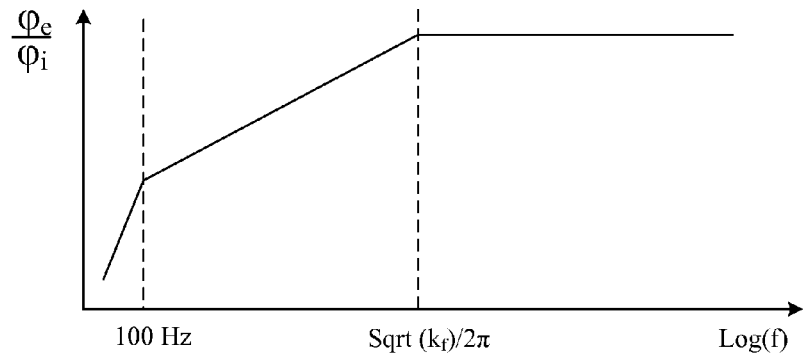
FIG. 9 is a graph showing the frequency dynamics of the circuit of FIG. 8.

As can be seen in FIG. 9, the high frequency dynamics are unchanged, and a low frequency pole is similarly added to better reject low frequency modulation and jitter.

Figure 10:
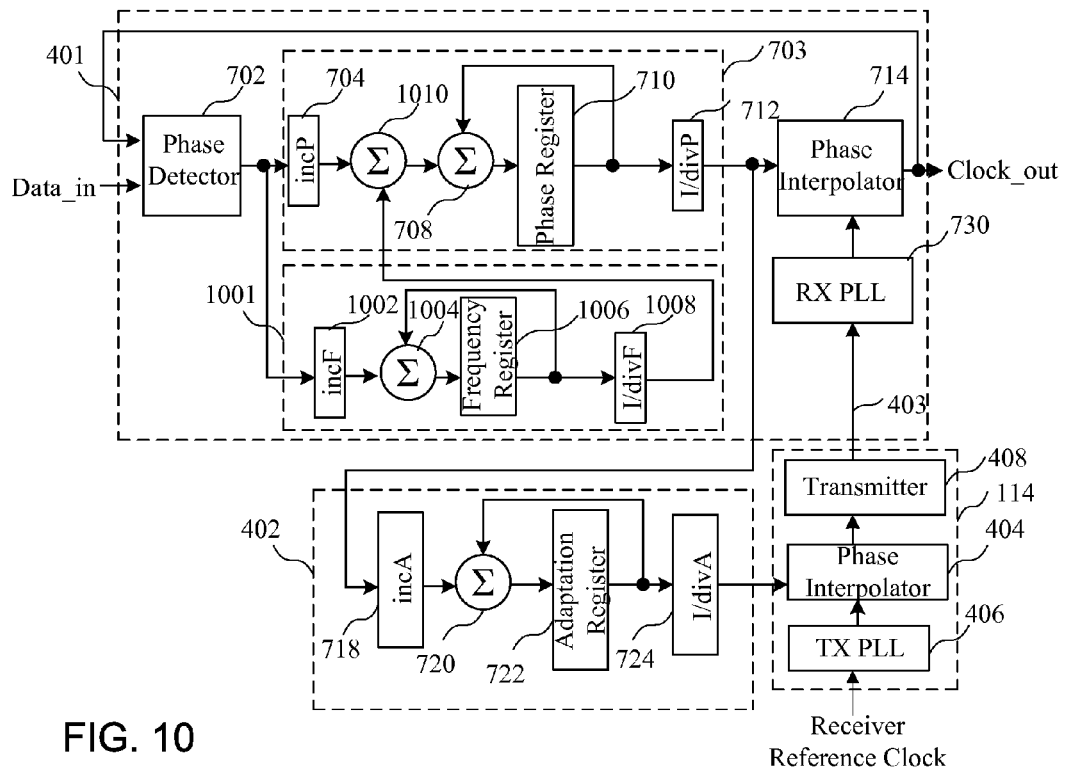
FIG. 10 is a more detailed block diagram showing a circuit for generating a clock signal to receive data using a second order clock and data recovery circuit and a linear adaptive reference clock implementing the circuit of FIG. 8.

As shown in FIG. 10, a more detailed block diagram shows a circuit for generating a clock signal to receive data using a second order clock and data recovery circuit and a linear adaptive reference clock circuit. The frequency control circuit 1001 as shown (which implements a frequency control loop) comprises a gain block 1002 having a multiply factor (incF) also coupled to receive an output of the phase detector 702. A summing circuit 1004 receives the output of the gain block 1002 and an output of a frequency register 1006 which stores a previous output of the summing circuit 1004. The output of the frequency register is also coupled to a second scaling factor, a divider block 1008 having a divider factor (I/divF). The output of the divider block 1008 is coupled to a summing circuit 1010, which also receives an input from the multiplier block 704 and generates an output to the summing circuit 708. Accordingly, the frequency control block 1001 provides frequency control to further improve the operation of the circuit. However, in either the embodiment of FIG. 7 or the embodiment of FIG. 10, the adaptation circuit 402 controls a first phase interpolator to provide a clock signal to a phase interpolator of the clock and data recovery circuit 403, where the adaptation circuit 402 generates the clock signal 403 based upon an output of the CDR circuit 401. It should be noted that the multiply values incP, incA and incF and the divider value I/divP, I/divA, and I/divF are programmable values, which may be initially programmed and maintained during the operation of the circuit.

Figure 11:
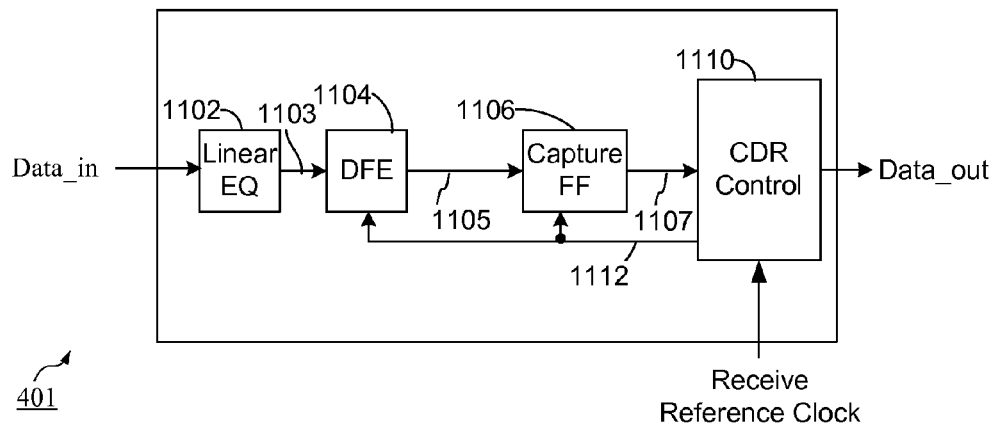
FIG. 11 is a block diagram of a clock and data recovery circuit.

Turning now to FIG. 11, a block diagram of a clock and data recovery circuit 401 is shown. The receiver includes a linear equalizer 1102, a decision feedback equalizer (DFE) circuit 1104, and a capture flip-flop 1106 coupled in series to provide a signal to a CDR Control circuit 1110. The DFE circuit 1104 generates a filtered signal on line 1105 from a signal on a line 1103. The filtered signal represents the first pass of filtering by the linear equalizer 1102 which attenuates low frequencies and/or amplifies high frequencies. The filtered signal on line 1103 may be a sum of the communication signal on line 1103 and a variable weighting of a binary symbol recently received sampled.

Capture flip-flop 1106 samples the filtered signal, where a path 1107 is a data path and a path 1109 is a replica path. An initial value provided as clock signal 1112 for receiving data can be continuously changed as described in FIGS. 5-10. That is, the circuits of FIG. 7 or 9 could be implemented as a part of the CDR control circuit 1110 to receive the input data, Data_in and generate the appropriate clock signal, Clock_out, to receive the input data and generate the output data, Data_out. While the clock and data recovery circuit of FIG. 11 shows various elements which are provided to recover data recovery circuit of FIG. 11 shows various elements which are proved to recover data, it should be understood that other elements or other circuits could be implemented according to the circuits and methods set forth above.

Figure 12:
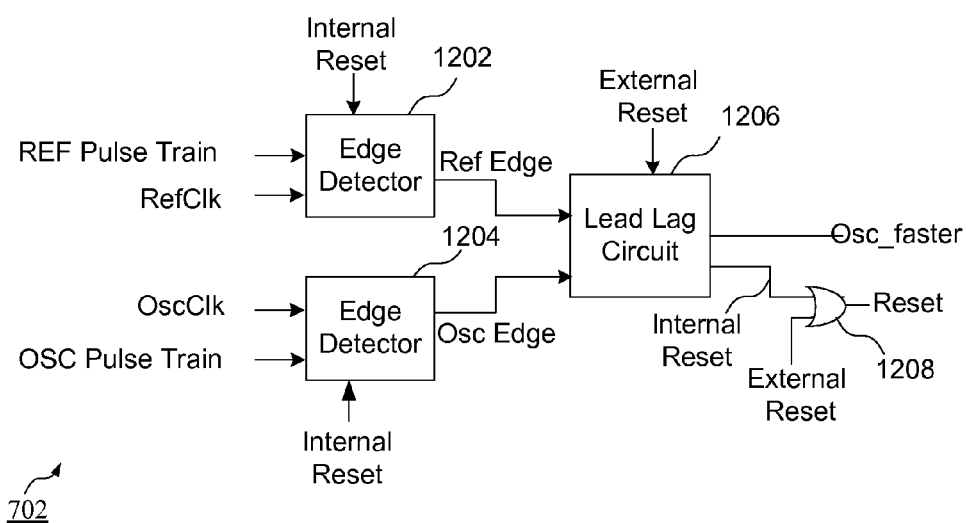
FIG. 12 is a block diagram of a phase detector.

Turning now to FIG. 12, a block diagram of a phase detector for detecting the frequency of an oscillator relative to a reference clock, which may be associated with received data for example, is shown. The phase detector 702 includes edge detector 1202 for the reference pulse train and edge detector 1204 for the oscillator pulse train, and a lead-lag state machine 1206. Phase detector is responsive to reference clock signal (RefClk) which may be associated with input data clock signal, an oscillator clock signal (OscClk) which may an output of a voltage controlled oscillator for example, a concurrence signal REF Pulse Train, and a concurrence signal OSC Pulse Train. Phase detector generates a control signal OSC_Faster. When clock signal OscClk is leading clock signal RefClk, an active control signal OSC_Faster is generated. Conversely, when clock signal OscClk is lagging clock signal RefClk, an inactive control signal OSC_Faster is generated. Control signal OSC_Faster may be used to guide the oscillator to produce clock signal OscClk having a frequency and phase such that clock signals OscClk and RefClk are synchronized. Concurrence signals OSC Pulse Train and REF Pulse Train act as gate signals to control the timing of phase comparisons between clock signals RefClk and OscClk.

In particular, edge detector 1202 is responsive to clock signal RefClk and concurrence signal REF Pulse Train. Similarly, edge detector 1204 is responsive to clock signal OscClk and concurrence signal OSC Pulse Train. Edge detector 1202 generates an edge detection signal REF_EDGE, and edge detector 1204 generates an edge detection signal OSC_EDGE. When concurrence signal REF_EDGE is in an active state, edge detector 1202 drives edge detection signal REF_EDGE to the active state when the next edge of clock signal RefClk arrives. When concurrence signal OSC_EDGE is in the active state, edge detector 1204 drives edge detection signal OSC_EDGE to the active state when the next edge of OscClk arrives. The edge detectors could be configured to detect positive edges of the clock signals or negative edges of the clock signals.

Edge detectors 1202 and 1204 could be asynchronous level-mode sequential circuits, for example, and asynchronously detect the next edge of their respective clock signals when their respective concurrence signals are in the active state. Thus, a level-change in a clock signal and/or a concurrence signal will cause a change in state of the edge detection signal and/or one or more internal signals in a given edge detector. A Lead-lag state machine 1206 is responsive to edge detection signals REF_EDGE and OSC_EDGE. Lead-lag state machine 1206 preferably incorporates asynchronous level-mode sequential circuitry in order to determine which of clock signals RefClk and OscClk is leading. If an edge of clock signal OscClk is detected first, lead-lag state machine 1206 drives control signal OSC_Faster to the active state. If an edge of input signal RefClk is detected, lead-lag state machine 1206 drives control signal OSC_faster to the inactive state. After each phase comparison, lead-lag state machine 1206 drives a reset signal INTERNAL_RESET to an active state. Reset signal INTERNAL_RESET is coupled to edge detectors 1202 and 1204 in order to reset edge detection signals REF_EDGE and OSC_EDGE, respectively, to an inactive state.

Figure 13:
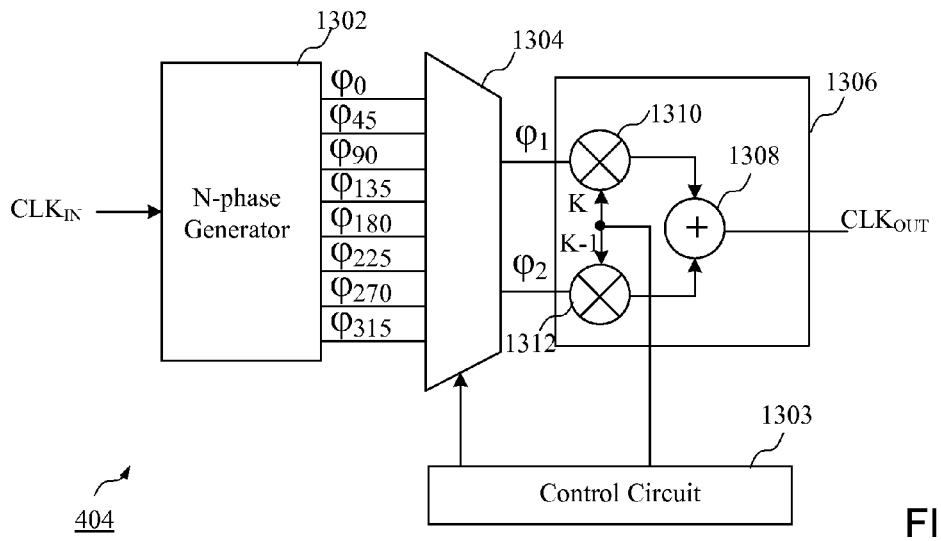
FIG. 13 is a block diagram of a phase interpolator.

Turning now to FIG. 13, a block diagram of a phase interpolator is shown. A phase interpolator plays an important role in a serial-link transceiver design. A phase interpolator is a circuit that has two periodic input signals which typically have the same period of oscillation and are derived from the same source. The two input signals are commonly referred to as I and Q phases of a clock signal, which could be 90 degrees apart, for example. A conventional phase interpolator generates arbitrary phases by switching the number of I and Q components, where the total number of I and Q components is a constant, thereby reducing the number of digital-to-analog converters (DACs).

The functional block diagram of the phase interpolator of FIG. 5 includes an N-phase generator 1302 which produces a number of primary phases, shown here for example as eight primary phases (0°, 45°, 90°, 135°, 180°, 225°, 270°, and 315°). A control circuit 1303 is coupled to a multiplexer 1304 for selecting particular phases, which may be two adjacent phases. The phase interpolation function according to the circuit of FIG. 13 is performed by the phase mixer having an adder circuit 1308 coupled to multiplier circuits 1310 and 1312. The multiplier circuits 1310 and 1312 are coupled to receive coefficients k and k−1, where k parts of $\phi_1$ are combined with (1−k) parts of $\phi_2$ (resulting in an interpolated phase output of $\phi_1 k + \phi_2 (1-k)$), and k is a fraction between 0 and 1. Accordingly, as shown in FIG. 13, particular phases of an input signal $CLK_{IN}$ may be proportionally combined to generate an output clock signal $CLK_{out}$. While the phase interpolator circuit of FIG. 13 is shown by way of example, it should be understood other phase interpolators could be implemented to perform the same function.

Figure 14:
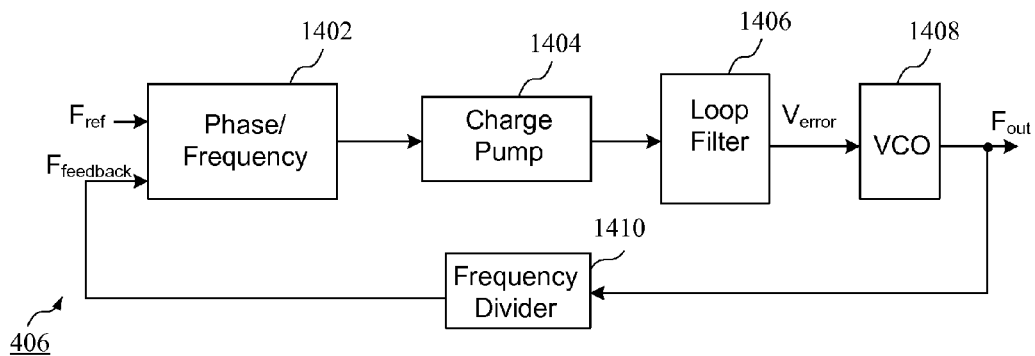
FIG. 14 is a block diagram of a phase locked loop.

Turning now to FIG. 14, a block diagram of a phase locked loop is shown. PLL 1400 consists of a phase/frequency detector 1402 that receives a reference signal ($F_{ref}$) and a feedback signal ($F_{feedback}$), a charge pump 1404, and a loop filter 1406 coupled to a voltage controlled oscillator 1408 which generates an output signal ($F_{out}$). Clock division may be necessary, for example, when the frequency of the output signal $F_{out}$ of the voltage controlled oscillator 1408 is operating in a high frequency range, such as 5 gigahertz (GHz), but reference signal $F_{ref}$ may only be operating at a relatively low frequency range, such as 156.25 megahertz (MHz). Accordingly, frequency divider 1410 enables generating a signal having a lower frequency.

In operation, phase/frequency detector 1402 supplies digital control signals (e.g., UP and DN, and their complementary signals, e.g., $\overline{UP}$ and $\overline{DN}$) corresponding to a phase/frequency error between $F_{ref}$ and $F_{feedback}$ output by the frequency divider 1410. For example, if the phase/frequency of $F_{feedback}$ is lagging the phase/frequency of $F_{ref}$, then the pulse width of signal UP may be increased and the pulse width of signal DN may be decreased to cause the phase/frequency of the voltage controlled oscillator 1408 to be advanced in phase/frequency. Conversely, if the phase/frequency of $F_{feedback}$ is advanced with respect to the phase/frequency of signal $F_{ref}$, then the pulse width of signal UP may be decreased and the pulse width of signal DN may be increased to cause the phase/frequency of the voltage controlled oscillator 1408 to be retarded in phase/frequency.

Charge pump 1404 reacts to the phase/frequency error signals output by the phase/frequency detector 1402 by generating a current signal. For example, if the pulse width of signal UP is increased, the magnitude of the current signal may also increase. Conversely, if the pulse width of signal DN is increased, then the magnitude of the current signal may also decrease. The current signal is then converted into an error voltage, $V_{error}$, by loop filter 1406, which is then supplied to voltage controlled oscillator 1408 to set the output frequency, $F_{out}$, of the voltage controlled oscillator 1408. $V_{error}$ may control one or more capacitors of the voltage controlled oscillator 1408, for example. Through negative feedback, the phase/frequency error between $F_{ref}$ and $F_{feedback}$ is forced to be substantially zero through operation of the voltage controlled oscillator 1408.

Figure 15:
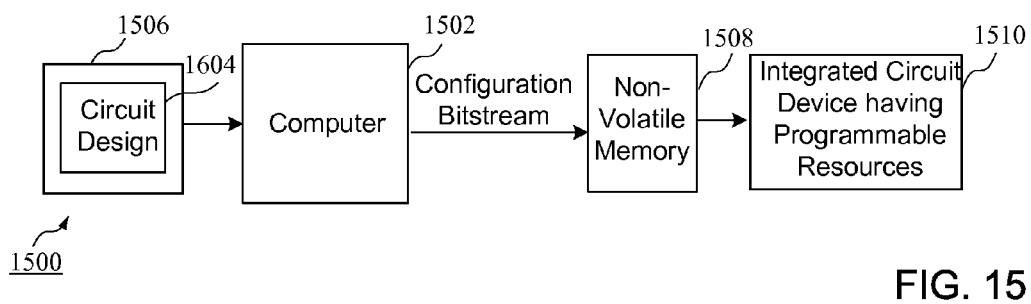
FIG. 15 is a block diagram of a system for programming a device having programmable resources.

Turning now to FIG. 15, a block diagram of a system for programming a device having programmable resources according to an embodiment is shown. In particular, a computer 1502 is coupled to receive a circuit design 1504 from a memory 1506, and generate a configuration bitstream which is stored in the non-volatile memory 1506. As will be described in more detail below, the circuit design may be a high level design, such as a circuit design defined in a hardware description language (HDL). Also, the computer may be configured to run software that generates a configuration bitstream which is stored in the non-volatile memory 1508 and provided to an integrated circuit 1510 which may be a programmable integrated circuit, such as the integrated circuit described below in FIG. 16.

Figure 16:
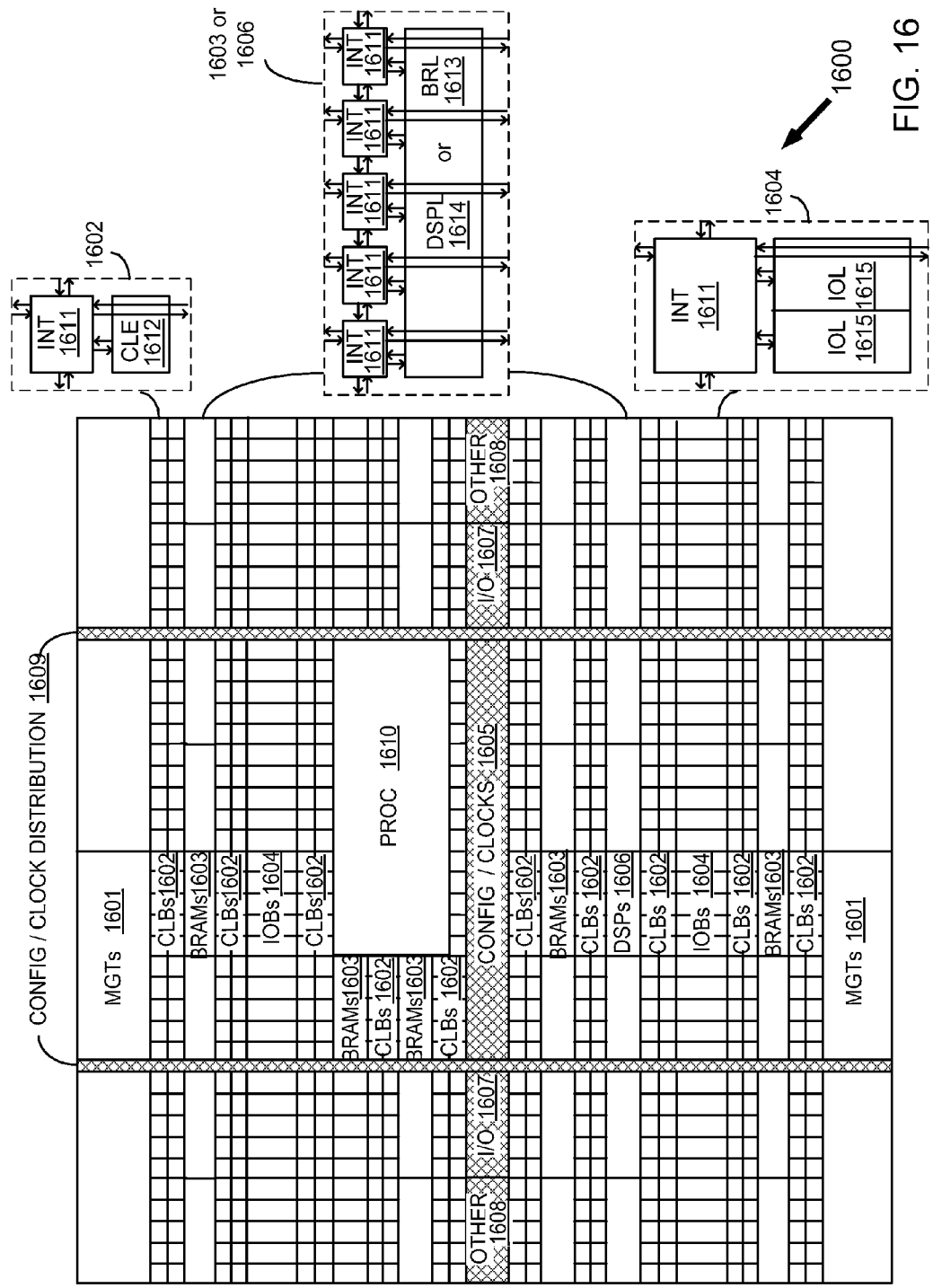
FIG. 16 is a block diagram of a device having programmable resources which may implement the circuits of FIGS. 1-14.

Turning now to FIG. 16, a block diagram of a device having programmable resources including the circuits of FIGS. 2-14 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 16 comprises an FPGA architecture 1600 having a large number of different programmable tiles including multi-gigabit transceivers (MGTs) 1601, CLBs 1602, random access memory blocks (BRAMs) 1603, input/output blocks (IOBs) 1604, configuration and clocking logic (CONFIG/CLOCKS) 1605, digital signal processing blocks (DSPs) 1606, specialized input/output blocks (I/O) 1607 (e.g., configuration ports and clock ports), and other programmable logic 1608 such as digital clock managers, analog-to-digital converters, system monitoring logic, and so forth.

Some FPGAs also include dedicated processor blocks (PROC) 1610, which may be used to implement a software application, for example.

In some FPGAs, each programmable tile includes a programmable interconnect element (INT) 1611 having standardized connections to and from a corresponding interconnect element in each adjacent tile. Therefore, the programmable interconnect elements taken together implement the programmable interconnect structure for the illustrated FPGA. The programmable interconnect element 1611 also includes the connections to and from the programmable logic element within the same tile, as shown by the examples included at the top of FIG. 16.

For example, a CLB 1602 may include a configurable logic element (CLE) 1612 that may be programmed to implement user logic plus a single programmable interconnect element 1611. A BRAM 1603 may include a BRAM logic element (BRL) 1613 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1606 may include a DSP logic element (DSPL) 1614 in addition to an appropriate number of programmable interconnect elements. An IOB 1604 may include, for example, two instances of an input/output logic element (IOL) 1615 in addition to one instance of the programmable interconnect element 1611. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1609 extending from this column are used to distribute the clocks and configuration signals across the breadth of the FPGA. Some FPGAs utilizing the architecture illustrated in FIG. 16 include additional logic blocks that disrupt the regular columnar structure making up a large part of the FPGA. The additional logic blocks may be programmable blocks and/or dedicated logic. For example, the processor block PROC 1610 shown in FIG. 16 spans several columns of CLBs and BRAMs.

Note that FIG. 16 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 16 are purely exemplary. For example, in an actual FPGA more than one adjacent column of CLBs is typically included wherever the CLBs appear in order to facilitate the efficient implementation of user logic. While the embodiment of FIG. 16 relates to an integrated circuit having programmable resources, it should be understood that the circuits and methods set forth in more detail below could be implemented in any type of ASIC.

Figure 17:
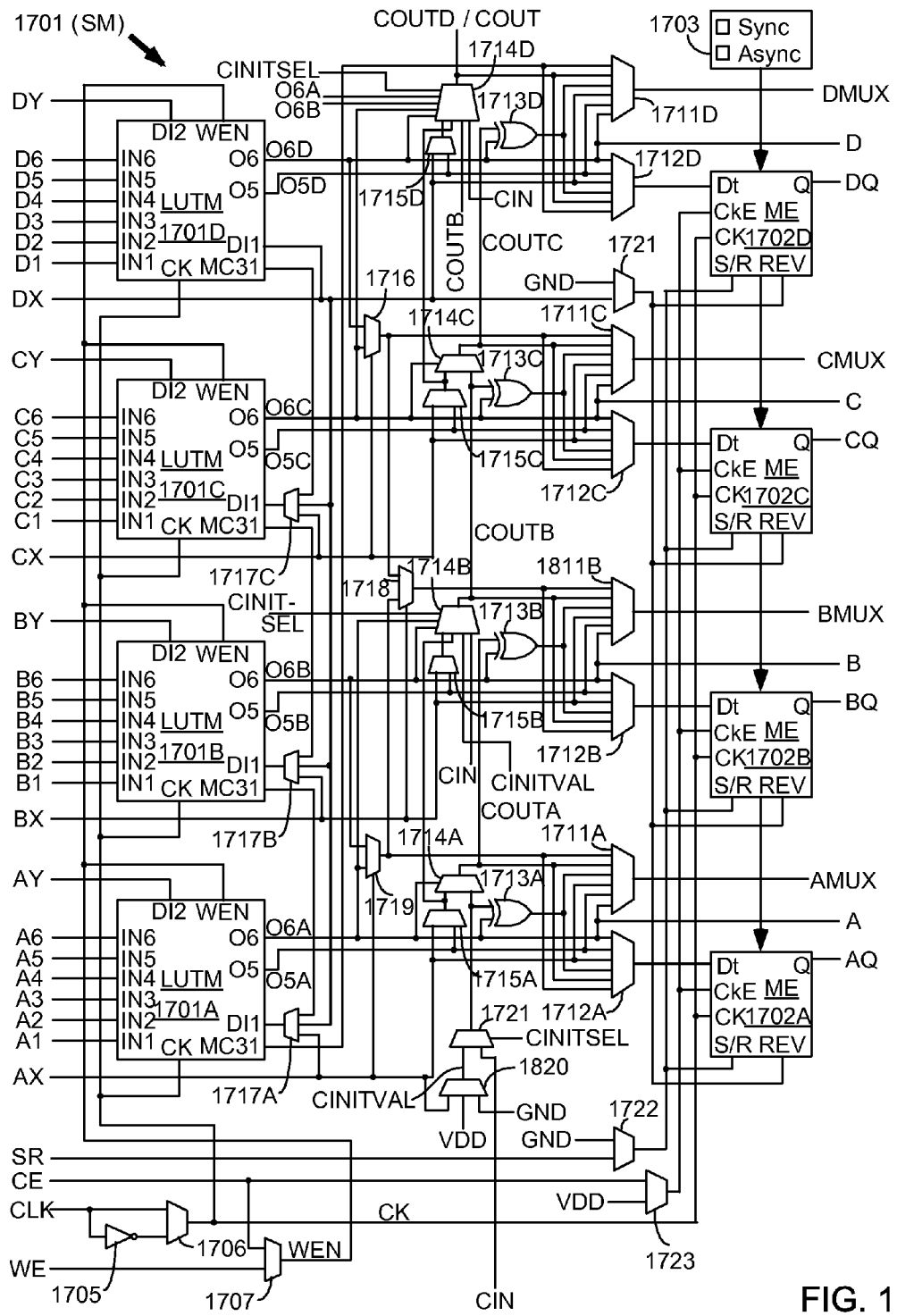
FIG. 17 is a block diagram of a configurable logic element of the device of FIG. 16.

Turning now to FIG. 17, block diagram of a configurable logic element of the device of FIG. 16 is shown. In particular, FIG. 17 illustrates in simplified form a configurable logic element of a configuration logic block 1602 of FIG. 16. In the embodiment of FIG. 17, slice M 1701 includes four lookup tables (LUTMs) 1701A-1701D, each driven by six LUT data input terminals A1-A6, B1-B6, C1-C6, and D1-D6 and each providing two LUT output signals O5 and O6. The O6 output terminals from LUTs 1701A-1701D drive slice output terminals A-D, respectively. The LUT data input signals are supplied by the FPGA interconnect structure via input multiplexers, which may be implemented by programmable interconnect element 1711, and the LUT output signals are also supplied to the interconnect structure. Slice M also includes: output select multiplexers 1711A-1711D driving output terminals AMUX-DMUX; multiplexers 1712A-1712D driving the data input terminals of memory elements 1702A-1702D; combinational multiplexers 1716, 1718, and 1719; bounce multiplexer circuits 1722-1723; a circuit represented by inverter 1705 and multiplexer 1706 (which together provide an optional inversion on the input clock path); and carry logic having multiplexers 1714A-1714D, 1715A-1715D, 1720-1721 and exclusive OR gates 1713A-1713D. All of these elements are coupled together as shown in FIG. 17. Where select inputs are not shown for the multiplexers illustrated in FIG. 17, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 17 for clarity, as well as from other selected figures herein.

In the pictured embodiment, each memory element 1702A-1702D may be programmed to function as a synchronous or asynchronous flip-flop or latch. The selection between synchronous and asynchronous functionality is made for all four memory elements in a slice by programming Sync/Asynch selection circuit 1703. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1702A-1702D are clocked by a clock signal CK, which may be provided by a global clock network or by the interconnect structure, for example. Such programmable memory elements are well known in the art of FPGA design. Each memory element 1702A-1702D provides a registered output signal AQ-DQ to the interconnect structure. Because each LUT 1701A-1701D provides two output signals, O5 and O6, the LUT may be configured to function as two 5-input LUTs with five shared input signals (IN1-IN5), or as one 6-input LUT having input signals IN1-IN6.

In the embodiment of FIG. 17, each LUTM 1701A-1701D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1717A-1717C for LUTs 1701A-1701C), or to the two 32-bit RAMs via input terminals DI1 and DI2. RAM write operations in the LUT RAMs are controlled by clock signal CK from multiplexer 1706 and by write enable signal WEN from multiplexer 1707, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1701A may also be provided to the general interconnect structure for shift register chaining, via output select multiplexer 1711D and CLE output terminal DMUX. Accordingly, the circuits and methods set forth above may be implemented in a device such as the devices of FIGS. 16 and 17, or any other suitable device.

Figure 18:
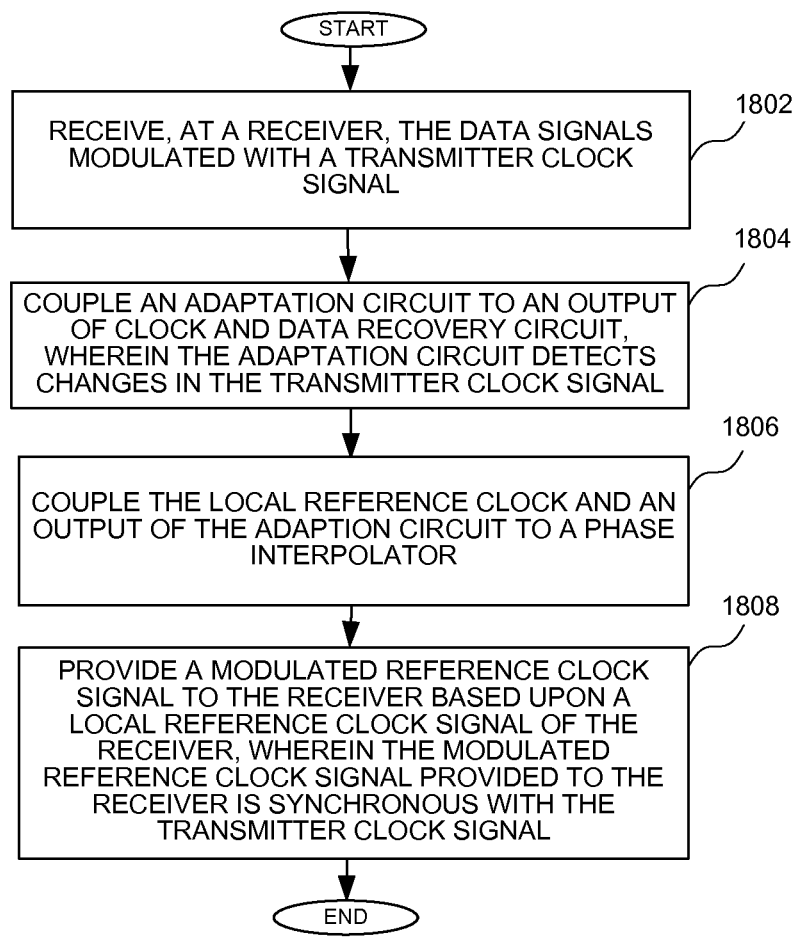
FIG. 18 is a flow chart showing a method of implementing a receiver in an integrated circuit device.

Turning now to FIG. 18, a flow chart shows a method of implementing a receiver in an integrated circuit device. In particular, data signals modulated with a transmitter clock signal are received, at a receiver at a step 1802. An adaptation circuit is couple to an output of clock and data recovery circuit, wherein the adaptation circuit detects changes in the transmitter clock signal at a step 1804. The local reference clock and an output of the adaption circuit are coupled to a phase interpolator at a step 1806. A modulated reference clock signal is provided to the receiver based upon a local reference clock signal of the receiver at a step 1808, wherein the modulated reference clock signal provided to the receiver is synchronous with the transmitter clock signal. The various elements of the method of FIG. 18 may be implemented using the circuits of FIGS. 1-17 as described, or using some other suitable circuits. While specific elements of the method are described, it should be understood that additional elements of the method, or additional details related to the elements 1802-1808, could be implemented according to the disclosure of FIGS. 1-17.

It can therefore be appreciated that a new circuit for and method of implementing a receiver in an integrated circuit device has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A transceiver in an integrated circuit device comprising:
a receiver circuit having a clock and data recovery circuit coupled to receive data signals modulated with a transmitter clock signal generated at another transceiver;
a transmitter circuit coupled to receive a reference clock signal; and
a clock generator of the transmitter circuit coupled to receive an output of the clock and data recovery circuit, the clock generator providing a modulated reference clock to a phase interpolator of the receiver circuit, based upon the reference clock signal which is independent of the transmitter clock signal;
wherein the modulated reference clock is synchronized with the transmitter clock signal.

2. The transceiver of claim 1 further comprising an adaptation circuit coupled to receive a slowly adapting parameter at the output of the clock and data recovery circuit.

3. The transceiver of claim 2 wherein the slowly adapting parameter indicates a phase offset between the data signals and a clock signal generated by the clock and data recovery circuit.

4. The transceiver of claim 3 wherein the adaptation circuit comprises a second order control circuit to provide a low frequency response.

5. The transceiver of claim 1 wherein the clock and data recovery circuit comprises a phase detector coupled to receive the data signals and a generated clock signal.

6. The transceiver of claim 5 wherein the clock and data recovery circuit comprises phase and frequency control loops coupled to an output of the phase detector.

7. The transceiver of claim 6 wherein the clock and data recovery circuit comprises the phase interpolator coupled to an output of the phase and frequency control loops.

8. A transceiver in an integrated circuit comprising:
a receiver circuit coupled to receive data signals modulated with a transmitter clock signal generated at another transceiver;
a transmitter circuit coupled to receive a reference clock signal;
an adaptation circuit coupled to the receiver circuit, the adaptation circuit detecting changes in a phase of the transmitter clock signal; and
a clock generator of the transmitter circuit coupled to receive an output of the adaptation circuit, the clock generator providing a modulated reference clock to a phase interpolator of the receiver circuit based upon the reference clock signal which is independent of the transmitter clock signal;
wherein the modulated reference clock is synchronized with the transmitter clock signal.

9. The transceiver of claim 8 wherein the clock generator comprises a second phase interpolator coupled to receive the reference clock signal and an output of the adaptation circuit.

10. The transceiver of claim 9 wherein the second phase interpolator is associated with the transmitter circuit of the integrated circuit device.

11. The transceiver of claim 8 wherein the receiver circuit comprises a clock and data recovery circuit having a phase detector coupled to receive the data signals and a generated clock signal.

12. The transceiver of claim 11 wherein the clock and data recovery circuit comprises phase and frequency control loops coupled to an output of the phase detector.

13. The transceiver of claim 12 wherein the clock and data recovery circuit comprises the phase interpolator coupled to an output of the phase and frequency control loops.

14. A method of receiving data in an integrated circuit device, the method comprising:
receiving, at a receiver of a first transceiver, data signals modulated with a transmitter clock signal of a second transceiver;
receiving, at the first transceiver, a reference clock signal which is independent of the transmitter clock signal;
providing, at a transmitter of the first transceiver, a modulated reference clock signal based upon the reference clock signal to a phase interpolator of the receiver of the first transceiver;
wherein the modulated reference clock signal is synchronous with the transmitter clock signal.

15. The method of claim 14 further comprising detecting changes in phase of the transmitter clock signal.

16. The method of claim 15 further comprising coupling the reference clock signal and an output of an adaption circuit to a second phase interpolator.

17. The method of claim 16 wherein the second phase interpolator is associated with the transmitter of the first transceiver of the integrated circuit device.

18. The method of claim 14 further comprising implementing a clock and data recovery circuit having a phase detector coupled to receive the data signals and a generated clock signal.

19. The method of claim 18 further comprising implementing phase and frequency control loops coupled to an output of the phase detector of the clock and data recovery circuit.

20. The method of claim 19 further comprising coupling the phase interpolator to an output of the phase and frequency control loops.

* * * * *